(12) United States Patent
Thurgood et al.

(10) Patent No.: US 6,879,050 B2
(45) Date of Patent: Apr. 12, 2005

(54) PACKAGED MICROELECTRONIC DEVICES AND METHODS FOR PACKAGING MICROELECTRONIC DEVICES

(75) Inventors: Blaine Thurgood, Nampa, ID (US); David Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 10/365,091

(22) Filed: Feb. 11, 2003

(65) Prior Publication Data

US 2004/0155331 A1 Aug. 12, 2004

(51) Int. Cl.$^7$ ............................................. H01L 23/28
(52) U.S. Cl. ....................................... 257/787; 257/739
(58) Field of Search ............................... 257/730, 739, 257/787

(56) References Cited

U.S. PATENT DOCUMENTS

| | | |
|---|---|---|
| 3,905,162 A | 9/1975 | Lawrence et al. |
| 4,587,771 A | 5/1986 | Buchner et al. |
| 4,756,968 A | 7/1988 | Ebe et al. |
| 4,782,029 A | 11/1988 | Takemura et al. |
| 5,107,328 A | 4/1992 | Kinsman |
| 5,128,831 A | 7/1992 | Fox, III et al. |
| 5,138,434 A | 8/1992 | Wood et al. |
| 5,197,271 A | 3/1993 | Robbins et al. |
| 5,223,734 A | 6/1993 | Lowrey et al. |
| 5,242,862 A | 9/1993 | Okabe et al. |
| 5,313,102 A | 5/1994 | Lim et al. |
| 5,504,022 A | 4/1996 | Nakanishi et al. |
| 5,554,569 A | 9/1996 | Ganesan et al. |
| 5,583,372 A | 12/1996 | King et al. |
| 5,593,927 A | 1/1997 | Farnworth et al. |
| 5,618,227 A | 4/1997 | Tsutsumi et al. |
| 5,622,875 A | 4/1997 | Lawrence |
| 5,632,667 A | 5/1997 | Earl et al. |
| 5,643,044 A | 7/1997 | Lund |
| 5,668,404 A * | 9/1997 | Abe et al. ................... 257/668 |
| 5,677,566 A | 10/1997 | King et al. |
| 5,696,033 A | 12/1997 | Kinsman |
| 5,739,585 A | 4/1998 | Akram et al. |
| 5,742,098 A * | 4/1998 | Brunner ..................... 257/730 |
| 5,753,535 A | 5/1998 | Ebihara |
| 5,756,380 A | 5/1998 | Berg et al. |
| D394,844 S | 6/1998 | Farnworth et al. |
| 5,773,362 A | 6/1998 | Tonti et al. |
| 5,780,204 A | 7/1998 | La et al. |
| 5,827,111 A | 10/1998 | Ball |

(Continued)

OTHER PUBLICATIONS

Aamagi, M. et al., "Cracking Failures in Lead–on–Chip Packages Induced by Chip Backside Contamination," IEEE Transactions on Components, Packaging, and Manufacturing Technology, Part B: Advanced Packaging, pp. 171–176, Feb. 1995, vol. 18, Issue 1, IEEE, Inc., Piscataway, New Jersey.

Primary Examiner—S. V. Clark
(74) Attorney, Agent, or Firm—Perkins Coie LLP

(57) ABSTRACT

Methods and apparatuses for packaging a microelectronic device. One embodiment can include a packaged microelectronic device comprising a microelectronic die, an interposer substrate, and a casing encapsulating at least a portion of the die. The microelectronic die can have a first side attached to the substrate, a plurality of contacts on the first side, and an integrated circuit coupled to the contacts. The die can also include a second side with a plurality of first interconnecting elements on the second side of the die, such as first non-planar features. The casing can include an interior surface and a plurality of second interconnecting elements on the interior surface, such as second non-planar features. The first non-planar features on the second side of the die mate with second non-planar features on the interior surface of the casing. Accordingly, delamination along the interface between the microelectronic die and the casing is inhibited.

69 Claims, 3 Drawing Sheets

U.S. PATENT DOCUMENTS

| | | |
|---|---|---|
| 5,836,807 A | 11/1998 | Leach |
| D402,638 S | 12/1998 | Farnworth et al. |
| 5,851,664 A | 12/1998 | Bennett et al. |
| 5,851,845 A | 12/1998 | Wood et al. |
| 5,864,174 A | 1/1999 | Yamada et al. |
| 5,866,953 A | 2/1999 | Akram et al. |
| 5,883,426 A | 3/1999 | Tokuno et al. |
| 5,891,753 A | 4/1999 | Akram |
| 5,891,797 A | 4/1999 | Farrar |
| 5,893,726 A | 4/1999 | Farnworth et al. |
| 5,894,218 A | 4/1999 | Farnworth et al. |
| 5,898,224 A | 4/1999 | Akram |
| 5,930,603 A | 7/1999 | Tsuji et al. |
| 5,933,713 A | 8/1999 | Farnworth |
| 5,938,956 A | 8/1999 | Hembree et al. |
| 5,946,553 A | 8/1999 | Wood et al. |
| 5,958,100 A | 9/1999 | Farnworth et al. |
| 5,986,209 A | 11/1999 | Tandy |
| 5,989,941 A | 11/1999 | Wensel |
| 5,989,971 A | 11/1999 | Tu et al. |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,008,074 A | 12/1999 | Brand |
| 6,018,249 A | 1/2000 | Akram et al. |
| 6,020,624 A | 2/2000 | Wood et al. |
| 6,020,629 A | 2/2000 | Farnworth et al. |
| 6,025,728 A | 2/2000 | Hembree et al. |
| 6,027,659 A | 2/2000 | Billett |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,066,514 A | 5/2000 | King et al. |
| 6,072,233 A | 6/2000 | Corisis et al. |
| 6,072,236 A | 6/2000 | Akram et al. |
| 6,075,288 A | 6/2000 | Akram |
| 6,089,920 A | 7/2000 | Farnworth et al. |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,122,171 A | 9/2000 | Akram et al. |
| 6,124,634 A | 9/2000 | Akram et al. |
| 6,130,474 A | 10/2000 | Corisis |
| 6,148,509 A | 11/2000 | Schoenfeld et al. |
| 6,150,717 A | 11/2000 | Wood et al. |
| 6,153,924 A | 11/2000 | Kinsman |
| 6,159,764 A | 12/2000 | Kinsman et al. |
| 6,163,956 A | 12/2000 | Corisis |
| 6,172,419 B1 | 1/2001 | Kinsman |
| 6,184,064 B1 * | 2/2001 | Jiang et al. ................. 438/113 |
| 6,184,465 B1 | 2/2001 | Corisis |
| 6,184,570 B1 * | 2/2001 | MacDonald et al. ........ 257/622 |
| 6,188,232 B1 | 2/2001 | Akram et al. |
| 6,198,172 B1 | 3/2001 | King et al. |
| 6,201,304 B1 | 3/2001 | Moden |
| 6,208,519 B1 | 3/2001 | Jiang et al. |
| 6,210,992 B1 | 4/2001 | Tandy et al. |
| 6,214,716 B1 | 4/2001 | Akram |
| 6,215,175 B1 | 4/2001 | Kinsman |
| 6,225,689 B1 | 5/2001 | Moden et al. |
| 6,228,548 B1 | 5/2001 | King et al. |
| 6,229,202 B1 | 5/2001 | Corisis |
| 6,232,666 B1 | 5/2001 | Corisis et al. |
| 6,239,489 B1 | 5/2001 | Jiang |
| 6,246,108 B1 | 6/2001 | Corisis et al. |
| 6,247,629 B1 | 6/2001 | Jacobson et al. |
| 6,252,772 B1 | 6/2001 | Allen |
| 6,258,623 B1 | 7/2001 | Moden et al. |
| 6,258,624 B1 | 7/2001 | Corisis |
| 6,259,153 B1 | 7/2001 | Corisis |
| 6,265,766 B1 | 7/2001 | Moden |
| 6,277,671 B1 | 8/2001 | Tripard |
| 6,281,042 B1 | 8/2001 | Ahn et al. |
| 6,284,571 B1 | 9/2001 | Corisis et al. |
| 6,285,204 B1 | 9/2001 | Farnworth |
| 6,291,894 B1 | 9/2001 | Farnworth et al. |
| 6,294,839 B1 | 9/2001 | Mess et al. |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,705 B1 | 12/2001 | Ahmad |
| 6,331,221 B1 | 12/2001 | Cobbley |
| 6,331,453 B1 | 12/2001 | Bolken et al. |
| 6,332,766 B1 | 12/2001 | Thummel |
| 6,344,976 B1 | 2/2002 | Schoenfeld et al. |
| 6,534,845 B1 * | 3/2003 | Yamada et al. ............. 257/669 |
| 6,710,442 B1 | 3/2004 | Lindgren et al. |

\* cited by examiner

PACKAGED MICROELECTRONIC DEVICES AND METHODS FOR PACKAGING MICROELECTRONIC DEVICES

TECHNICAL FIELD

The present invention relates to microelectronic device assemblies and methods for packaging microelectronic devices. More particularly, several aspects of the present invention are related to the interface between a microelectronic die and a casing that encapsulates a portion of the die.

BACKGROUND

Microelectronic devices, such as memory devices and microprocessors, often include a microelectronic die or "chip" that is packaged in a plastic, ceramic, or metal casing. The die generally has integrated circuitry and a plurality of bond-pads coupled to the integrated circuitry. For example, the integrated circuitry can include memory cells, processor circuits, interconnecting circuitry, and/or other components. The microelectronic device can also include an interposer substrate having a plurality of traces coupled to the bond-pads on the die and an array of ball-pads electrically connected to the traces. Each ball-pad typically carries a solder-ball to define a "ball-grid" array. In other applications, the microelectronic device can include a lead frame with metal leads instead of an interposer substrate. Packaged microelectronic devices with ball-grid array connections generally have lower profiles and higher pin counts than packages that use a lead frame.

Several different techniques have been developed for packaging microelectronic dies. The dies, for example, can be incorporated into individual protective packages, mounted with other components in a hybrid or multiple-chip module, or connected directly to a printed circuit board. In many packaging applications, the bond-pads on the die are coupled to a lead frame or a ball-grid array using wire bonds. After coupling the bond-pads to a lead frame or a ball-grid array, the dies are encased with a plastic, a ceramic, or another type of protective material.

The microelectronic package is subject to thermal cycling during bake-in, testing, and solder reflow processes. For example, solder reflow processes for surface mounting and through-hole mounting techniques are performed at approximately 220° C.; the packaged devices are then cooled. Microelectronic packages are also subject to thermal cycling during operation that can range from several degrees for a personal computer to several hundred degrees for extreme uses, such as in avionics.

One problem with packaged microelectronic devices is that thermal cycling induces stresses that can cause components to delaminate. The stresses are induced because the materials in a microelectronic package have different Coefficients of Thermal Expansion ("CTE") so that they do not expand and contract the same amount during thermal cycling. As such, delamination often occurs at the interfaces between various components in the microelectronic package.

SUMMARY

The present invention is directed toward methods and apparatuses for packaging a microelectronic device. One aspect of an embodiment is directed toward a packaged microelectronic device comprising a microelectronic die, an interposer substrate, and a casing encapsulating at least a portion of the die. The interposer substrate can have a first surface, a second surface opposite the first surface, and a plurality of ball-pads on the second surface. The microelectronic die can have a first side attached to the first surface of the substrate, a plurality of contacts on the first side, and an integrated circuit coupled to the contacts. The contacts of the die can be electrically coupled to the ball-pads of the substrate by a plurality of connectors. The die can also include a second side and a plurality of first interconnecting elements on the second side of the die, such as first non-planar features. The casing can encapsulate the die and at least a portion of the first surface of the substrate. The casing can include an interior surface and a plurality of second interconnecting elements on the interior surface, such as second non-planar features. The first non-planar features on the second side of the die mate with corresponding second non-planar features on the interior surface of the casing. Accordingly, delamination along the interface between the microelectronic die and the casing is inhibited.

Another aspect of the invention is directed toward methods of manufacturing packaged microelectronic devices. In an aspect of one embodiment of the invention, a method can include adding or removing material from the backside of the microelectronic die to form a plurality of non-planar features. The method can include etching or laser drilling to remove the material. The non-planar features can be a series of recesses, protrusions, ridges, or trenches.

DETAILED DESCRIPTION

The following description is directed toward packaged microelectronic devices, methods for manufacturing packaged microelectronic devices, and methods for manufacturing a casing/die interface in microelectronic devices. Many specific details of several embodiments are described below using examples of packaged microelectronic devices having microelectronic dies and interposer substrates to provide a thorough understanding of such embodiments. The present invention, however, can be practiced using leadframes or other types of redistribution members, or micromechanical devices can be used instead of microelectronic devices. Those of ordinary skill in the art will thus understand that the invention may have additional embodiments, or that the invention may be practiced without several of the details described in this section.

Figure 1:
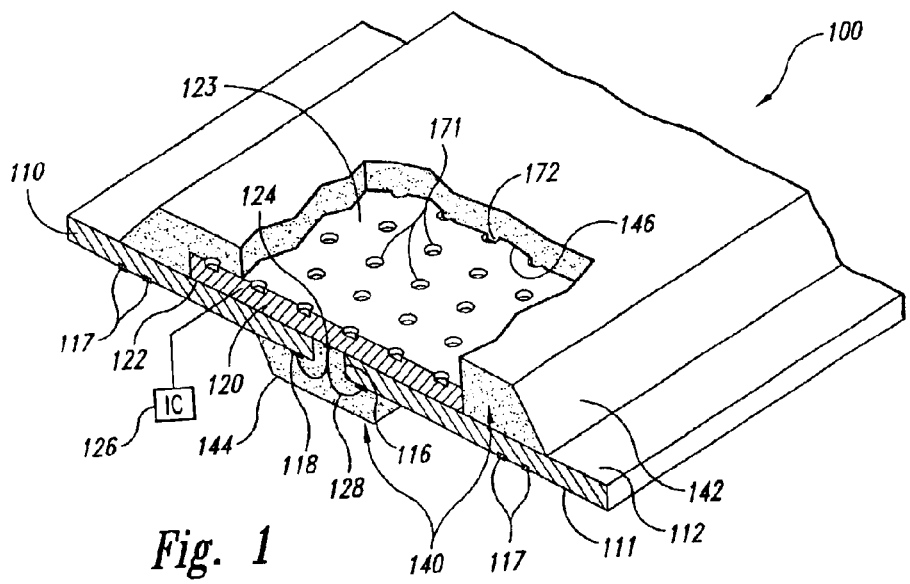
FIG. 1 is a top cutaway isometric view of a microelectronic device packaged in accordance with a method of one embodiment of the invention.

FIG. 1 is a top cutaway isometric view of a microelectronic device 100 in accordance with one embodiment of the invention. The microelectronic device 100 includes an interposer substrate 110 and a microelectronic die 120 attached to the interposer substrate 110 by an adhesive. The interposer substrate 110 is one type of redistribution member that can be used in the microelectronic device 100, but in other embodiments a lead frame can be used to redistribute the contacts on the die 120 to a larger array. The microelectronic device 100 shown in FIG. 1 illustrates the interposer substrate 110 and the microelectronic die 120 after encapsulating the die 120 with a casing 140. The cutaway section is provided to show further detail of the interface between the die 120 and the casing 140.

In the illustrated embodiment, the interposer substrate 110 has a first surface 111, a second surface 112 opposite the first surface 111, and an elongated slot 116 between the first and second surfaces 111 and 112. The elongated slot 116 can extend lengthwise along a medial portion of the interposer substrate 110. The interposer substrate 110 provides an array of ball-pads 117 and terminal pads 118 for coupling very small contacts on the microelectronic die 120 to a printed circuit board or another type of device. In the embodiment shown in FIG. 1, the array of terminal pads 118 are proximate to the slot 116 to be connected to the die 120, and the ball-pads 117 are spaced apart from the terminal pads 118 to provide an array with a sufficient pitch to be connected to another device using surface mounting techniques. The ball-pads 117 are electrically coupled to the terminal pads 118 by conductive traces (not shown) on or in the interposer substrate 110. The interposer substrate 110 can be a flexible material or a substantially rigid material. In several embodiments, the interposer substrate is an organic material, such as FR4.

The embodiment of the microelectronic die 120 shown in FIG. 1 includes a front side 122 attached to the second surface 112 of the interposer substrate 110 by an adhesive and a backside 123 facing away from the interposer substrate 110. The microelectronic die 120 includes a plurality of small bond-pads 124 and an integrated circuit 126 (shown schematically) coupled to the bond-pads 124. The bond-pads 124 are arranged in an array along the front side 122 of the microelectronic die 120 so that the bond-pads 124 are aligned with or are otherwise accessible through the slot 116 in the interposer substrate 110. A plurality of wire bonds 128 or other types of connectors couple the bond-pads 124 to corresponding terminal pads 118 on the interposer substrate 110. As such, the interposer substrate 110 redistributes the very small bond-pads 124 to the larger array of ball-pads 117.

The casing 140 in the particular embodiment shown in FIG. 1 includes (a) a first cover 142 over the backside 123 of the die 120 and a portion of the second surface 112 of the interposer substrate 110; and (b) a second cover 144 over the bond-pads 124, terminal pads 118, and wire bonds 128. The first cover 142 has an interior surface 146 covering the backside 123 of the die 120. The casing 140 can have many other configurations in which only one side of the substrate is covered by the casing, such as applications that use an interposer substrate without a slot and mount the backside of the die to the interposer substrate. The casing 140 can be molded around the die 120 and wire bonds 128 using injection molding techniques. Accordingly, the casing 140 can be a suitable molding compound, including, but not limited to, epoxies, silicones, silicone-carbon resins, polymides, polyurethanes, thermoset resins, and other materials.

The backside 123 of the microelectronic die 120 engages the interior surface 146 of the casing 140. The backside 123 of the die 120 includes a series of first non-planar features 171, and the interior surface 146 of the casing 140 includes corresponding second non-planar features 172. The non-planar features 171 and 172 define interface elements or interconnecting elements that inhibit relative movement between the die 120 and the first cover 142 of the casing 140 along the interior surface 146. The first non-planar features 171 are arranged in an array along the backside 123 of the die 120 so the first non-planar features 171 are aligned with or are otherwise engaged with the second non-planar features 172. The non-planar features 171 and 172 in the present embodiment can include a series of recesses, protrusions, ridges, and/or trenches. In the embodiment shown in FIG. 1, the first interface elements 171 are small recesses in the die 120 and the second interface elements 172 are small protrusions on the interior surface 146. The height or depth of the interface elements can be approximately 5–200 $\mu$m and is more generally 10–50 $\mu$m.

One advantage of the embodiment illustrated in FIG. 1 is that the non-planar features 171 and 172 restrict movement between the backside 123 of the microelectronic die 120 and the casing 140 that can occur during bake-in, testing, solder reflow processes, and other thermal cycling events. The interface elements, more specifically, provide a mechanical interlock that prevents shear forces along the backside of the die from causing relative movement between the die and the casing. Without the interface elements, such movement can cause delamination between the die 120 and the casing 140. The interface elements also increase the contact surface area between the die and the casing, which increases the adhesion between the backside of the die and the molding compound of the casing. Thus, the non-planar features 171 and 172 restrict movement between the components to reduce delamination.

The non-planar features 171 can be formed by adding or removing material from the backside 123 of the microelectronic die 120 either at the wafer level before the dies are singulated, or at the die level after singulation. Laser drilling or etching processes can be used to remove material from the backside 123 to form recesses and trenches. Protrusions and ridges can be formed by adding material to the backside 123 of the die 120. Those of ordinary skill in the art will recognize that other methods can be used to add or remove material from a microelectronic die to form non-planar interface elements.

Figures 2A, 2B:
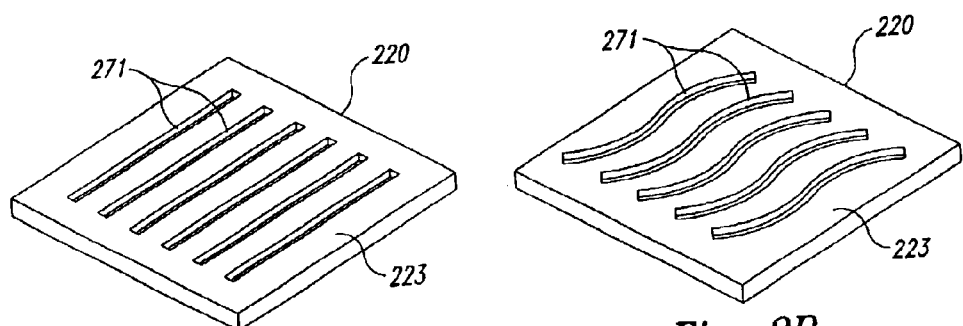
FIG. 2A is a top isometric view of the backside of a microelectronic die in accordance with an embodiment of the invention.
FIG. 2B is a top isometric view of the backside of a microelectronic die in accordance with an embodiment of the invention.

FIG. 2A is a top isometric view of a microelectronic die 220 showing several first non-planar features 271 along the backside 223 of the die 220. In one embodiment, the first non-planar features 271 are a series of elongated linear trenches or ridges. When a casing is formed over the microelectronic die 220, the molding compound can conform the first non-planar features 271 to form a set of second non-planar features on the interior surface of the casing. The second non-planar features mate with the first non-planar features 271 to inhibit delamination between the microelectronic die 220 and the casing. FIG. 2B demonstrates another embodiment of this invention in which the first non-planar features 271 are a series of arcuate, non-linear ridges or trenches. As with the first non-planar features shown in FIG. 2A, the first non-planar features 271 shown in FIG. 2B engage a second set of non-planar features on the interior of the casing to inhibit delamination.

Figure 2C:
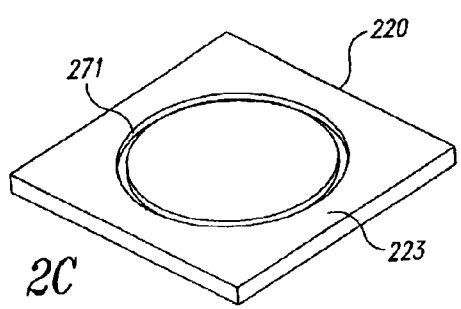
FIG. 2C is a top isometric view of the backside of a microelectronic die in accordance with an embodiment of the invention.

FIG. 2C is an isometric view showing another embodiment in which the first non-planar feature 271 is a continuous band, such as a ridge or trench, on the backside 223 of the die 220. The band can be formed using laser drilling or etching to remove material from the backside 223 of the die 220. Alternatively, material can be added to the backside 223 of the die 220 to form the band. As described above with respect to FIGS. 2A and 2B, the first non-planar feature 271 in FIG. 2C engages a corresponding second non-planar feature on the interior of the casing to reduce delamination.

Figure 3A:
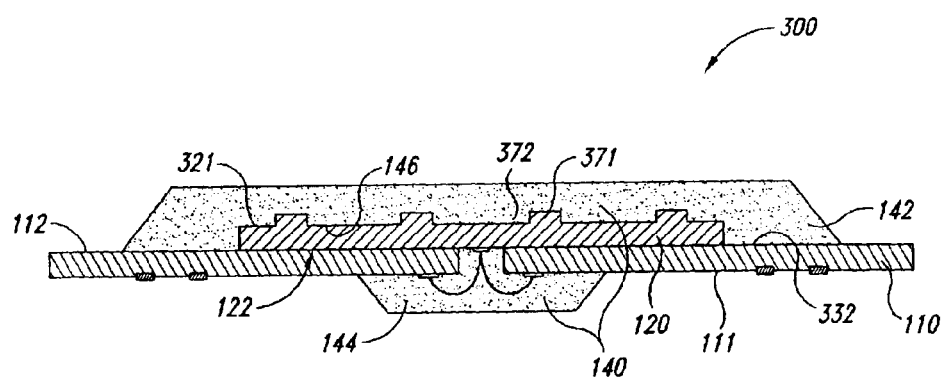
FIG. 3A is a cross-sectional view of a microelectronic device having an interposer substrate and a microelectronic die in accordance with another embodiment of the invention.

FIG. 3A is a cross-sectional view of a microelectronic device 300 having an interposer substrate 110, a microelectronic die 120 coupled to the interposer substrate 110, and a casing 140 in accordance with another embodiment of the invention. The interposer substrate 110 and the microelectronic die 120 can be similar to the interposer substrate 110 and microelectronic die 120 mentioned above with reference to FIG. 1. The backside 123 of the die 120 includes a series of first interconnecting elements 371, and the interior surface 146 of the casing 140 includes corresponding second interconnecting elements 372. The first interconnecting elements 371 are arranged in an array along the backside 123 of the die 120 so that the first interconnecting elements are aligned or are otherwise engaged with the second interconnecting elements 372. As illustrated, the first interconnecting elements 371 are small protrusions and the second interconnecting elements 372 are small recesses formed around the protrusions.

Figure 3B:
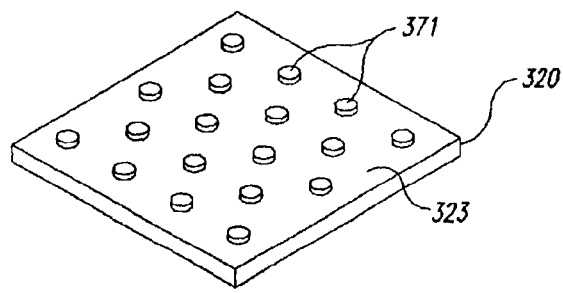
FIG. 3B is a top isometric view of the backside of a microelectronic die in accordance with an embodiment of the invention.
Figure 3C:
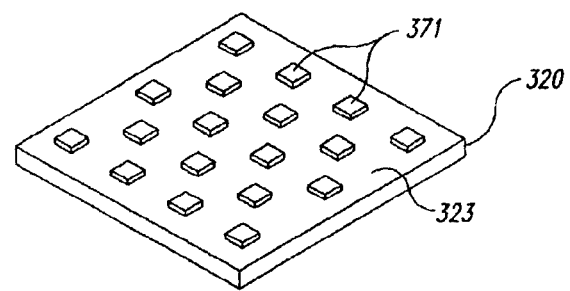
FIG. 3C is a top isometric view of the backside of a microelectronic die in accordance with an embodiment of the invention.

FIG. 3B is a top isometric view of a microelectronic die 320 showing several first interconnecting elements 371 along the backside 323 of the die 320. In one embodiment, the first interconnecting elements 371 can be cylindrical. FIG. 3C illustrates another embodiment in which the first interconnecting elements 371 are rectilinear protrusions projecting from the backside 323 of the die 320. When a casing is formed over the microelectronic die 320, the molding compound can conform to the first interconnecting elements 371 to form a set of second interconnecting elements on the interior surface of the casing.

The interconnecting elements 371 of the embodiments in FIGS. 3B and 3C can be manufactured using a variety of methods. The first interconnecting elements 371 can be formed by adding or removing material from the backside 323 of the microelectronic die 320. For example, the protrusions can be formed by removing the material between the protrusions using laser drilling or etching processes, or the protrusions can be formed by adding material to the backside 323 of the die 320.

Figure 4:
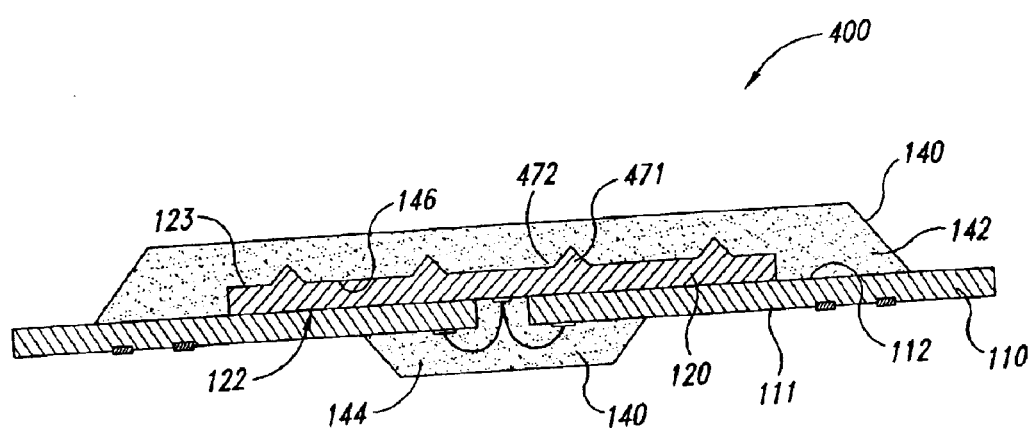
FIG. 4 is a cross-sectional view of a microelectronic device having an interposer substrate and a microelectronic die in accordance with another embodiment of the invention.

FIG. 4 is a cross-sectional view of a microelectronic device 400 having an interposer substrate 110 and a microelectronic die 120 coupled to the interposer substrate 110 in accordance with another embodiment of the invention. The interposer substrate 110 and the microelectronic die 120 can be similar to the interposer substrate 110 and microelectronic die 110 mentioned above with reference to FIG. 1. The backside 123 of the die 120 includes a plurality of first interconnecting elements 471, and the interior surface 146 of the casing 140 includes a plurality of corresponding second interconnecting elements 472. As illustrated, the interconnecting elements 471 and 472 can include a series of conical or pyramidical elements. The interconnecting elements 471 and 472 also inhibit relative movement between the backside 123 of the die 120 and the interior surface 146 of the casing 140.

From the foregoing, it will be appreciated that several embodiments of the present invention have been described herein for purposes of illustration, but that various modifications may be made without deviating from the spirit and scope of the present invention. Accordingly, the present invention is not limited, except as by the appended claims.

We claim:

1. A packaged microelectronic device, comprising:
   a redistribution member having an interposer substrate with a plurality of terminals, an array of ball-pads, and traces electrically coupling the terminals to the ball-pads;
   a microelectronic die including integrated circuitry, an active side adjacent to the interposer substrate and having a plurality of bond-pads electrically coupled to the terminals, and a backside, wherein the backside of the die includes a surface and a first non-planar feature relative to the surface; and
   a casing comprising a mold compound, the casing having an interior surface covering at least a portion of the backside of the die, wherein the interior surface of the casing includes a second non-planar feature engaged with the first non-planar feature of the die, wherein the first and second non-planar features have a height and/or a depth of greater than 25 $\mu$m to approximately 200 $\mu$m.

2. The microelectronic device of claim 1 wherein:
   the backside of the die includes a plurality of first non-planar features defined by recesses; and
   the interior surface of the casing includes a plurality of second non-planar features defined by protrusions that mate with the first non-planar features.

3. The microelectronic device of claim 1 wherein:
   the backside of the die includes a plurality of first non-planar features defined by recesses;
   the interior surface of the casing includes a plurality of second non-planar features defined by protrusions that mate with the first non-planar features; and
   the first and second non-planar features are rectilinear.

4. The microelectronic device of claim 1 wherein:
   the backside of the die includes a plurality of first non-planar features defined by recesses;
   the interior surface of the casing includes a plurality of second non-planar features defined by protrusions that mate with the first non-planar features; and
   the first and second non-planar features are arcuate.

5. The microelectronic device of claim 1 wherein:
   the backside of the die includes a plurality of first non-planar features defined by recesses;
   the interior surface of the casing includes a plurality of second non-planar features defined by protrusions that mate with the first non-planar features; and
   the first and second non-planar features are conical.

6. The microelectronic device of claim 1 wherein:
   the backside of the die includes a plurality of first non-planar features defined by recesses;
   the interior surface of the casing includes a plurality of second non-planar features defined by protrusions that mate with the first non-planar features; and
   the first and second non-planar features are pyramidical.

7. The microelectronic device of claim 1 wherein:
   the backside of the die includes a plurality of first non-planar features defined by protrusions; and
   the interior surface of the casing includes a plurality of second non-planar features defined by recesses that mate with the first non-planar features.

8. The microelectronic device of claim 1 wherein:
the backside of the die includes a plurality of first non-planar features defined by protrusions;
the interior surface of the casing includes a plurality of second non-planar features defined by recesses that mate with the first non-planar features; and
the first and second non-planar features are rectilinear.

9. The microelectronic device of claim 1 wherein:
the backside of the die includes a plurality of first non-planar features defined by protrusions;
the interior surface of the casing includes a plurality of second non-planar features defined by recesses that mate with the first non-planar features; and
the first and second non-planar features are arcuate.

10. The microelectronic device of claim 1 wherein:
the backside of the die includes a plurality of first non-planar features defined by protrusions;
the interior surface of the casing includes a plurality of second non-planar features defined by recesses that mate with the first non-planar features; and
the first and second non-planar features are conical.

11. The microelectronic device of claim 1 wherein:
the backside of the die includes a plurality of first non-planar features defined by protrusions;
the interior surface of the casing includes a plurality of second non-planar features defined by recesses that mate with the first non-planar features; and
the first and second non-planar features are pyramidical.

12. The microelectronic device of claim 1 wherein:
the backside of the die includes a plurality of first non-planar features defined by ridges; and
the interior surface of the casing includes a plurality of second non-planar features defined by trenches that mate with the first non-planar features.

13. The microelectronic device of claim 1 wherein:
the backside of the die includes a plurality of first non-planar features defined by parallel ridges; and
the interior surface of the casing includes a plurality of second non-planar features defined by trenches that mate with the first non-planar features.

14. The microelectronic device of claim 1 wherein:
the backside of the die includes a plurality of first non-planar features defined by ridges;
the interior surface of the casing includes a plurality of second non-planar features defined by trenches that mate with the first non-planar features;
a first set of first and second non-planar features is a first configuration and a second set of first and second non-planar features is a second configuration; and
the first and second configurations are generally similar.

15. The microelectronic device of claim 1 wherein:
the backside of the die includes a first non-planar feature defined by a continuous ridge; and
the interior surface of the casing includes a second non-planar feature defined by a trench that mates with the first non-planar feature.

16. The microelectronic device of claim 1 wherein:
the backside of the die includes a plurality of first non-planar features defined by trenches; and
the interior surface of the casing includes a plurality of second non-planar features defined by ridges that mate with the first non-planar features.

17. A packaged microelectronic device, comprising:
a redistribution member having an interposer substrate with a plurality of terminals, an array of ball-pads, and traces electrically coupling the terminals to the ball-pads;
a microelectronic die including integrated circuitry, an active side adjacent to the interposer substrate and having a plurality of bond-pads electrically coupled to the terminals, and a backside, wherein the backside of the die includes a first interconnecting element; and
a casing comprising a mold compound, the casing having an interior surface facing the backside of the die and including a second interconnecting element engaged with the first interconnecting element of the die to restrict relative movement between the backside of the die and the interior surface of the casing, wherein the first and second interconnecting elements have a height and/or a depth of greater than 25 μm to approximately 200 μm.

18. The microelectronic device of claim 17 wherein:
the backside of the die includes a plurality of first interconnecting elements defined by recesses; and
the interior surface of the casing includes a plurality of second interconnecting elements defined by protrusions that mate with the first interconnecting elements.

19. The microelectronic device of claim 17 wherein:
the backside of the die includes a plurality of first interconnecting elements defined by recesses;
the interior surface of the casing includes a plurality of second interconnecting elements defined by protrusions that mate with the first interconnecting elements; and
the first and second interconnecting elements are rectilinear.

20. The microelectronic device of claim 17 wherein:
the backside of the die includes a plurality of first interconnecting elements defined by recesses;
the interior surface of the casing includes a plurality of second interconnecting elements defined by protrusions that mate with the first interconnecting elements; and
the first and second interconnecting elements are arcuate.

21. The microelectronic device of claim 17 wherein:
the backside of the die includes a plurality of first interconnecting elements defined by recesses;
the interior surface of the casing includes a plurality of second interconnecting elements defined by protrusions that mate with the first interconnecting elements; and
the first and second interconnecting elements are conical.

22. The microelectronic device of claim 17 wherein:
the backside of the die includes a plurality of first interconnecting elements defined by recesses;
the interior surface of the casing includes a plurality of second interconnecting elements defined by protrusions that mate with the first interconnecting elements; and
the first and second interconnecting elements are pyramidical.

23. The microelectronic device of claim 17 wherein:
the backside of the die includes a plurality of first interconnecting elements defined by protrusions; and
the interior surface of the casing includes a plurality of second interconnecting elements defined by recesses that mate with the first interconnecting elements.

24. The microelectronic device of claim 17 wherein:
the backside of the die includes a plurality of first interconnecting elements defined by protrusions;

the interior surface of the casing includes a plurality of second interconnecting elements defined by recesses that mate with the first interconnecting elements; and the first and second interconnecting elements are rectilinear.

25. The microelectronic device of claim 17 wherein:

the backside of the die includes a plurality of first interconnecting elements defined by protrusions;

the interior surface of the casing includes a plurality of second interconnecting elements defined by recesses that mate with the first interconnecting elements; and the first and second interconnecting elements are arcuate.

26. The microelectronic device of claim 17 wherein:

the backside of the die includes a plurality of first interconnecting elements defined by protrusions;

the interior surface of the casing includes a plurality of second interconnecting elements defined by recesses that mate with the first interconnecting elements; and the first and second interconnecting elements are conical.

27. The microelectronic device of claim 17 wherein:

the backside of the die includes a plurality of first interconnecting elements defined by protrusions;

the interior surface of the casing includes a plurality of second interconnecting elements defined by recesses that mate with the first interconnecting elements; and the first and second interconnecting elements are pyramidical.

28. A packaged microelectronic device, comprising:

a die having integrated circuitry, an active side having a plurality of bond-pads, and a backside having a plurality of first interface elements;

a redistribution member coupled to the die, the redistribution member having an array of ball-pads electrically coupled to corresponding bond-pads of the die; and a casing comprising a mold compound enclosing at least a portion of the die and at least a portion of the redistribution member, the casing having an interior surface facing the backside of the die, and the interior surface of the casing including a plurality of second interface elements engaged with corresponding first interface elements to inhibit delamination between the die and the casing along the backside of the die, wherein the first and second interface elements have a height and/or a depth of greater than 25 $\mu$m to approximately 200 $\mu$m.

29. The microelectronic device of claim 28 wherein:

the first interface elements are recesses; and the second interface elements are protrusions that mate with the first interface elements.

30. The microelectronic device of claim 28 wherein:

the first interface elements are recesses;

the second interface elements are protrusions that mate with the first interface elements; and the first and second interface elements are rectilinear.

31. The microelectronic device of claim 28 wherein:

the first interface elements are recesses;

the second interface elements are protrusions that mate with the first interface elements; and the first and second interface elements are arcuate.

32. The microelectronic device of claim 28 wherein:

the first interface elements are recesses;

the second interface elements are protrusions that mate with the first interface elements; and the first and second interface elements are conical.

33. The microelectronic device of claim 28 wherein:

the first interface elements defined by recesses;

the second interface elements are protrusions that mate with the first interface elements; and the first and second interface elements are pyramidical.

34. The microelectronic device of claim 28 wherein:

the first interface elements are protrusions; and the second interface elements are recesses that mate with the first interface elements.

35. The microelectronic device of claim 28 wherein:

the first interface elements are protrusions;

the second interface elements are recesses that mate with the first interface elements; and the first and second interface elements are rectilinear.

36. The microelectronic device of claim 28 wherein:

the first interface elements are protrusions;

the second interface elements are recesses that mate with the first interface elements; and the first and second interface elements are arcuate.

37. The microelectronic device of claim 28 wherein:

the first interface elements are protrusions;

the second interface elements are recesses that mate with the first interface elements; and the first and second interface elements are conical.

38. The microelectronic device of claim 28 wherein:

the first interface elements are protrusions;

the second interface elements are recesses that mate with the first interface elements; and the first and second interface elements are pyramidical.

39. The microelectronic device of claim 28 wherein:

the first interface elements are ridges; and the second interface elements are trenches that mate with the first interface elements.

40. The microelectronic device of claim 28 wherein:

the first interface elements are trenches; and the second interface elements are ridges that mate with the first interface elements.

41. A packaged microelectronic device, comprising:

a die having integrated circuitry, an active side including a plurality of bond-pads, and a backside having a recess extending into the die;

a redistribution member coupled to the die, the redistribution member having an array of ball-pads electrically coupled to the bond-pads; and a casing comprising a mold compound covering at least a portion of the die and at least a portion of the redistribution member, the casing having an interior surface facing the backside of the die, and the interior surface of the casing conforming to the recess on the backside of the die, wherein the recess has a depth of greater than 25 $\mu$m to approximately 200 $\mu$m.

42. The microelectronic device of claim 41 wherein the recess extending into the die is rectilinear.

43. The microelectronic device of claim 41 wherein the recess extending into the die is arcuate.

44. The microelectronic device of claim 41 wherein the recess extending into the die is conical.

45. The microelectronic device of claim 41 wherein the recess extending into the die is pyramidical.

46. A packaged microelectronic device, comprising:

a die having integrated circuitry, an active side including a plurality of bond-pads, and a backside having a protrusion projecting away from the die;

a redistribution member coupled to the die, the redistribution member having an array of ball-pads electrically coupled to the bond-pads; and a casing comprising a mold compound covering at least a portion of the die and at least a portion of the redistribution member, the casing having an interior surface facing the backside of the die, and the interior surface of the casing conforming to the protrusion on the backside of the die, wherein the protrusion has a height of greater than 25 μm to approximately 200 μm.

47. The microelectronic device of claim 46 wherein the recess extending into the die is rectilinear.

48. The microelectronic device of claim 46 wherein the recess extending into the die is arcuate.

49. The microelectronic device of claim 46 wherein the recess extending into the die is conical.

50. The microelectronic device of claim 46 wherein the recess extending into the die is pyramidical.

51. A method of forming a packaged microelectronic device, comprising:

forming an interface element having a height and/or a depth of greater than 25 μm to approximately 200 μm on a backside of a die, the die having an integrated circuit and an active side with bond pads;

attaching the die to a redistribution member having an array of ball-pads and electrically coupling the bond-pads to the ball-pads; and molding a die compound to (a) cover at least a portion of the backside of the die and (b) conform to the interface element.

52. The method of claim 51 wherein forming an interface element on the backside of the die comprises depositing material on the backside of the die.

53. The method of claim 51 wherein forming an interface element on the backside of the die comprises removing material from the backside of the die.

54. The method of claim 51 wherein forming an interface element on the backside of the die comprises forming a plurality of recesses on the backside of the die.

55. The method of claim 51 wherein forming an interface element on the backside of the die comprises forming a plurality of protrusions on the backside of the die.

56. The method of claim 51 wherein forming an interface element on the backside of the die comprises forming a plurality of ridges on the backside of the die.

57. The method of claim 51 wherein forming an interface element on the backside of the die comprises forming a plurality of trenches on the backside of the die.

58. The method of claim 51 wherein forming an interface element on the backside of the die comprises etching a recess in the backside of the die.

59. The method of claim 51 wherein forming an interface element on the backside of the die comprises laser drilling a recess in the backside of the die.

60. A method of forming a packaged microelectronic device having a die including an active side and a backside, wherein the backside includes a planar surface, the method comprising:

forming an interface element having a height and/or a depth of greater than 25 μm to approximately 200 μm on the backside of the die, the interface element being non-planar relative to the surface on the backside of the die, and the die having bond-pads on the active side;

attaching the die to a redistribution member having an array of ball-pads and electrically coupling the bond-pads to the ball-pads; and molding a die compound to (a) cover at least a portion of the backside of the die and (b) conform to the interface element.

61. The method of claim 60 wherein forming a non-planar interface element on the backside of the die comprises depositing material on the backside of the die.

62. The method of claim 60 wherein forming a non-planar interface element on the backside of the die comprises removing material from the backside of the die.

63. The method of claim 60 wherein forming a non-planar interface element on the backside of the die comprises forming a plurality of recesses on the backside of the die.

64. The method of claim 60 wherein forming a non-planar interface element on the backside of the die comprises forming a plurality of protrusions on the backside of the die.

65. The method of claim 60 wherein forming a non-planar interface element on the backside of the die comprises forming a plurality of ridges on the backside of the die.

66. The method of claim 60 wherein forming a non-planar interface element on the backside of the die comprises forming a plurality of trenches on the backside of the die.

67. A method of forming a packaged microelectronic device having a die including an active side and a backside, wherein the backside includes a planar surface, the method comprising:

forming an interconnecting element having a height and/or a depth of greater than 25 μm to approximately 200 μm on the backside of the die, the interconnecting element being non-planar relative to the surface on the backside of the die, and the die having bond-pads on the active side;

attaching the die to a redistribution member having an array of ball-pads and electrically coupling the bond-pads to the ball-pads; and molding a die compound to (a) cover at least a portion of the backside of the die and (b) conform to the interconnecting element.

68. A method of forming a packaged microelectronic device having a die including an active side having bond-pads and a backside, wherein the backside includes a planar surface, the method comprising:

forming a recess having a depth of greater than 25 μm to approximately 200 μm on the backside of a die;

attaching the die to a redistribution member having an array of ball-pads and electrically coupling the bond-pads to the ball-pads; and molding a die compound to (a) cover at least a portion of the backside of the die and (b) conform to the recess on the backside of the die.

69. A method of forming a packaged microelectronic device having a die including an active side having bond-pads and a backside, wherein the backside includes a planar surface, the method comprising:

forming a protrusion having a height of greater than 25 μm to approximately 200 μm projecting away from the backside of a die;

attaching the die to a redistribution member having an array of ball-pads and electrically coupling the bond-pads to the ball-pads; and molding a die compound to (a) cover at least a portion of the backside of the die and (b) conform to the protrusion on the backside of the die.

* * * * *